United States Patent
Sato et al.

(10) Patent No.: US 9,455,119 B2
(45) Date of Patent: Sep. 27, 2016

(54) CHARGED PARTICLE BEAM APPARATUS

(71) Applicant: HITACHI HIGH-TECH SCIENCE CORPORATION, Minato-ku, Tokyo (JP)

(72) Inventors: Makoto Sato, Tokyo (JP); Tatsuya Asahata, Tokyo (JP); Masahiro Kiyohara, Tokyo (JP); Ikuko Nakatani, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 14/665,391

(22) Filed: Mar. 23, 2015

(65) Prior Publication Data

US 2015/0270096 A1  Sep. 24, 2015

(30) Foreign Application Priority Data

Mar. 24, 2014  (JP) .................. 2014-060000

(51) Int. Cl.
  *H01J 37/26* (2006.01)
  *G21K 5/04* (2006.01)
  *H01J 37/28* (2006.01)

(52) U.S. Cl.
  CPC .............. *H01J 37/28* (2013.01); *H01J 37/265* (2013.01); *H01J 2237/30438* (2013.01)

(58) Field of Classification Search
  USPC ............... 250/305, 306, 307, 309, 310, 311, 250/492.1, 492.3
  See application file for complete search history.

(56) References Cited

U.S. PATENT DOCUMENTS

| 2001/0019109 A1* | 9/2001 | Yamaguchi | G01N 23/04 250/311 |
| 2006/0151701 A1* | 7/2006 | Tsuneta | H01J 37/1474 250/310 |
| 2006/0255270 A1* | 11/2006 | Kitamura | H01J 37/222 250/310 |
| 2007/0024528 A1* | 2/2007 | Kobaru | H01J 37/265 345/32 |

FOREIGN PATENT DOCUMENTS

JP  2007294391  11/2007

* cited by examiner

*Primary Examiner* — Nicole Ippolito
(74) *Attorney, Agent, or Firm* — Adams & Wilks

(57) ABSTRACT

A charged particle beam apparatus is provided with a controller configured to control other components and perform operations including: an irradiating operation to irradiate a first position of a sample with a charged particle beam while gradually changing a scan range of the charged particle beam to move from a first position; a first image acquiring operation to acquire an image of each portion where the charged particle beam moves; an indicator forming operation to form an indicator at a second position by the charged particle beam when the scan range of the charged particle beam reaches the second position; a second image acquiring operation to acquire an image of the second position in a state where the indicator is formed; and an adjusting operation to adjust relative position between the stage and the scan range of the charged particle beam.

8 Claims, 7 Drawing Sheets

CHARGED PARTICLE BEAM APPARATUS

CROSS-REFERENCE TO RELATED APPLICATION

This application claims priority from Japanese Patent Application No. 2014-060000, filed on Mar. 24, 2014, the entire subject matter of which is incorporated herein by reference.

BACKGROUND

1. Technical Field

The present invention relates to a charged particle beam apparatus.

2. Description of the Related Art

As an apparatus for processing and observing the surface of a sample such as a semiconductor device, a charged particle beam apparatus is known (see, for example, JP-A-2007-294391). The charged particle beam apparatus has a stage which holds a sample, a charged particle beam tube which irradiates a charged particle beam onto the surface of the sample held on the stage, a detector which detects secondary electrons emitted from the surface of the sample due to the irradiation with the charged particle beam, and an image forming unit which forms an image of the surface of the sample based on the detected secondary electrons.

This charged particle beam apparatus can be used, for example, to count repetitive patterns formed on the surface of a sample. In this case, the charged particle beam apparatus irradiates a charged particle beam along the repetitive patterns, thereby obtaining an image, and counts the patterns shown in the image. By counting the patterns, it is possible to specify, for example, a designated pattern from among the repetitive patterns. Under the circumstances, in order to display images of different positions of the surface of a sample, mainly, the stage is moved.

However, in a case of performing counting while moving the stage, vibration, drift, or the like of the stage may occur, whereby images may be deteriorated, which can become a factor of incorrect counting. Also, in recent semiconductor devices, there is a case where repetitive patterns are formed, for example, with a pitch of 20 nm or less. In this case, since the accuracy of fine movement (about 10 nm) of the stage is required, vibration, drift, or the like of the stage becomes a factor of incorrect counting. Like this, in a case of observing the surface of a sample while moving the stage, there is a case where observation accuracy decreases due to influence of vibration or the like of the stage.

SUMMARY

The present invention has been made in view of the above-described circumstances, and one of the objects of the present invention is to provide a charged particle beam apparatus having high observation accuracy.

According to an exemplary embodiment of the present invention, there is provided a charged particle beam apparatus including: a stage configured to hold a sample and be movable; a charged particle beam irradiation unit configured to irradiate the sample with a charged particle beam; an image acquiring unit configured to detect secondary electrons generated from the sample due to the irradiation with the charged particle beam and to acquire images of the sample; and a controller configured to control other components and perform operations including: an irradiating operation to irradiate a first position of the sample with the charged particle beam while gradually changing a scan range of the charged particle beam such that the scan range of the charged particle beam moves from the first position; a first image acquiring operation to control the image acquiring unit to acquire an image of each portion where the charged particle beam moves; an indicator forming operation to form an indicator at a second position by the charged particle beam when the scan range of the charged particle beam reaches the second position; a second image acquiring operation to control the image acquiring unit to acquire an image of the second position in a state where the indicator is formed; and an adjusting operation to adjust relative position between the stage and the scan range of the charged particle beam.

BRIEF DESCRIPTION OF THE DRAWINGS

The above and other aspects of the present invention will become more apparent and more readily appreciated from the following description of illustrative embodiments of the present invention taken in conjunction with the attached drawings, in which.

DETAILED DESCRIPTION

Hereinafter, an embodiment of the present invention will be described with reference to the accompanying drawings.

Figure 1:
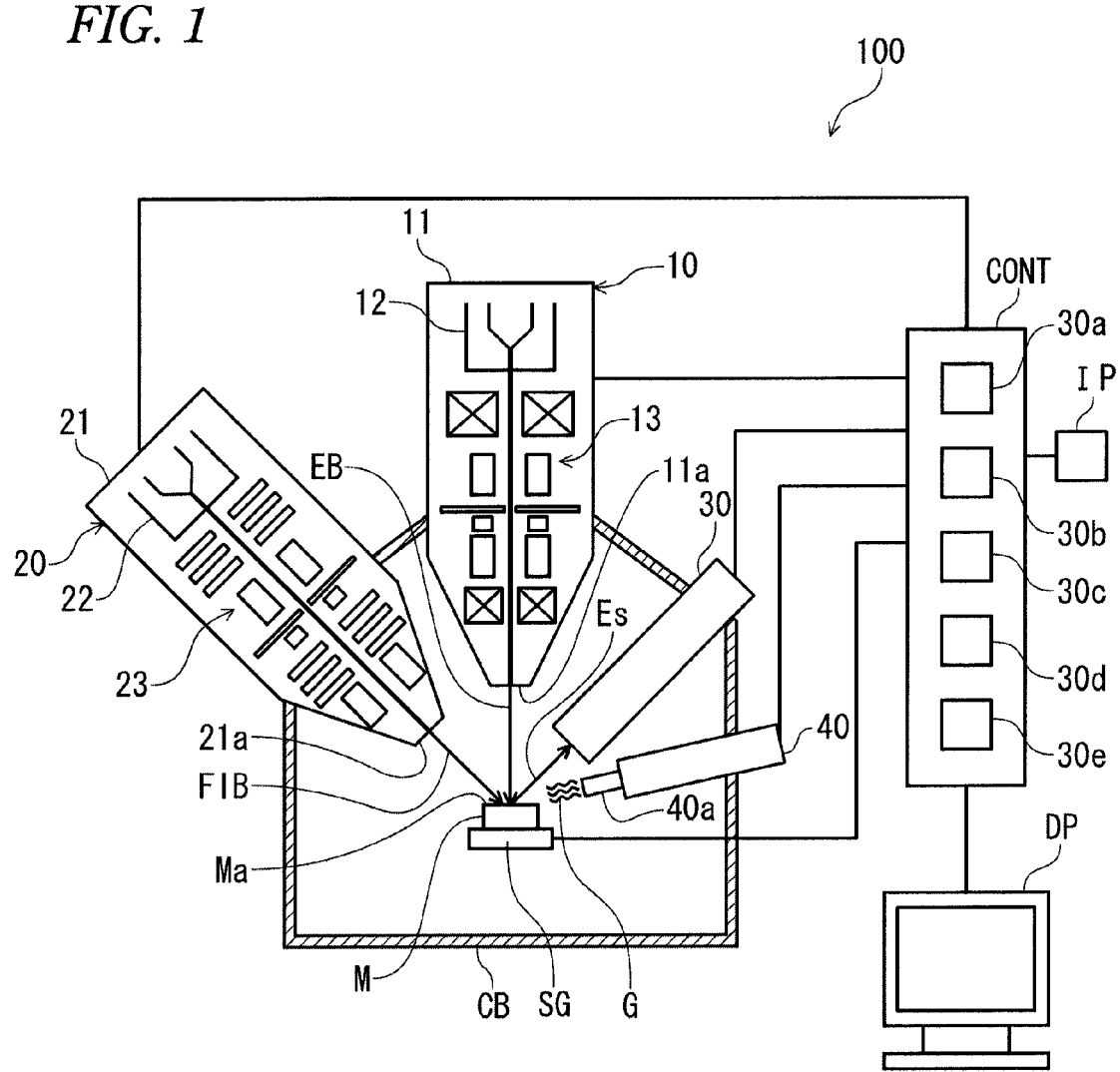
FIG. 1 is a schematic diagram illustrating a configuration of a charged particle beam apparatus 100.

FIG. 1 is a schematic diagram illustrating a configuration of a charged particle beam apparatus 100.

As shown in FIG. 1, the charged particle beam apparatus 100 is provided with an electron beam irradiation unit 10 which irradiates an electron beam EB, a focused ion beam irradiation unit 20 which irradiates a focused ion beam FIB, a secondary electron detecting unit 30, a gas supplying unit 40, a stage SG which holds a sample M, a vacuum chamber CB, a controller CONT, and a display DP.

The electron beam irradiation unit 10 is provided with a tube 11, an electron beam source 12, and an electron beam optical system 13. The tube 11 is formed in a cylindrical shape, and has a central axis extending in a predetermined direction. The electron beam source 12 and the electron beam optical system 13 are disposed inside the tube 11. The electron beam irradiation unit 10 has a configuration in which an electron beam generated by the electron beam source 12 is narrowed by the electron beam optical system 13, whereby an electron beam EB is formed, and the corresponding electron beam EB is irradiated from an emission port 11a of the tube 11.

Figure 2:
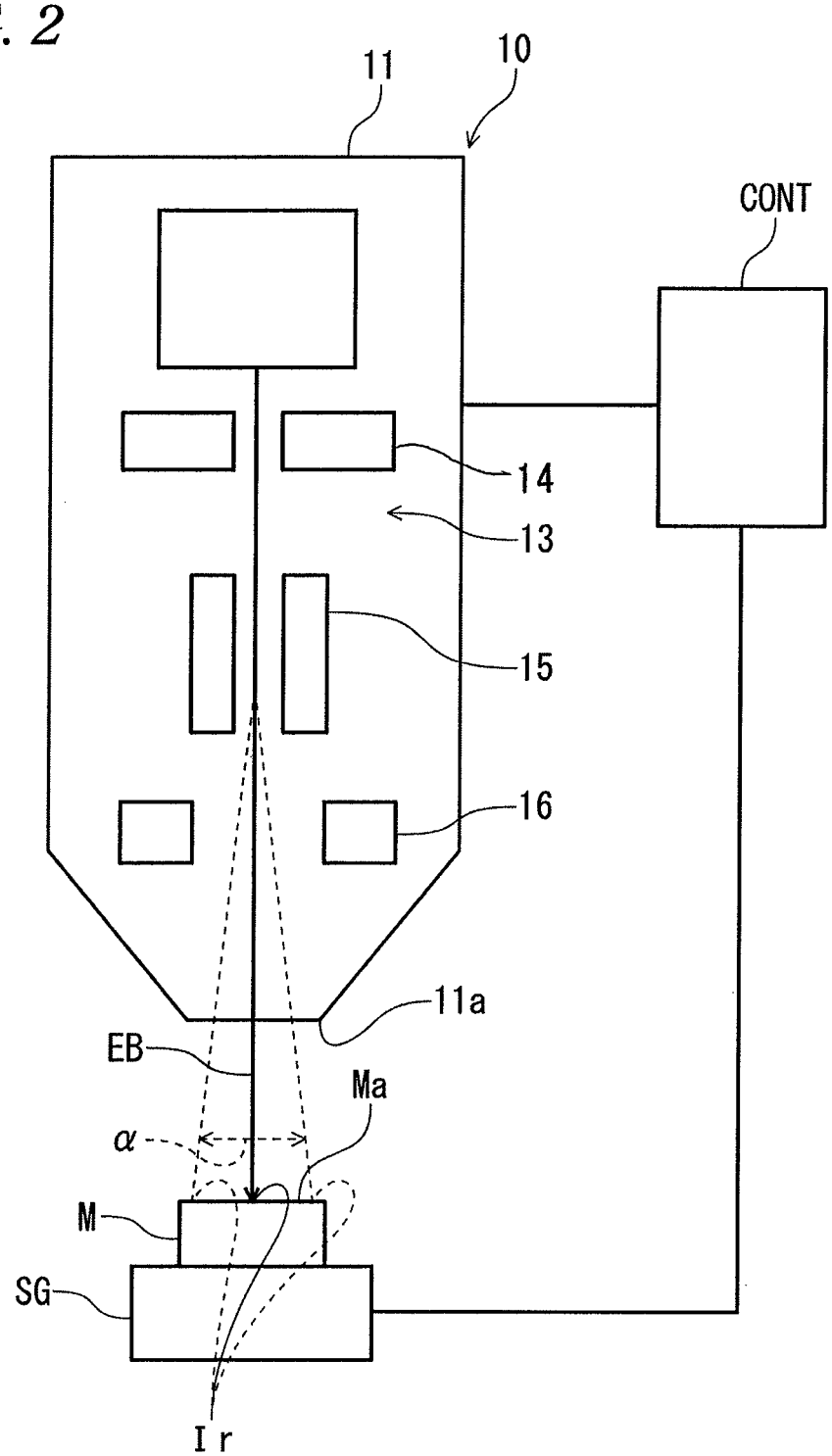
FIG. 2 is a view illustrating the internal configuration of a tube 11 of an electron beam irradiation unit 10.

FIG. 2 is a view illustrating the internal configuration of the tube 11 of the electron beam irradiation unit 10. In FIG.

2, there is shown the relation among the positions of the electron beam optical system 13, the sample M, and the stage SG.

The electron beam optical system 13 includes a condenser lens electrode 14 which focuses the electron beam EB, a scan electrode 15 which scans the surface Ma of the sample M with the electron beam EB, and an object lens electrode 16 which focuses the electron beam EB on the surface Ma. Due to the scan electrode 15, a predetermined range is scanned with the electron beam EB, and the scan range of the electron beam EB is variable within a range of a predetermined angle a. Since the scan range of the electron beam EB varies, the position Ir of the scan range of the electron beam EB can be changed on the surface Ma of the sample M. The scan electrode 15 can adjust the scan range of the electron beam EB such that the position Ir of the scan range two-dimensionally moves on the surface Ma. The operation of the scan electrode 15 is controlled by an image shift unit 30d of the controller CONT.

As shown in FIG. 1, the focused ion beam irradiation unit 20 is provided with a tube 21, an ion beam source 22, and an ion beam optical system 23. The tube 21 is formed in a cylindrical shape, and is disposed such that the central axis of the tube 21 is inclined to the central axis of the tube 11. The ion beam source 22 and the ion beam optical system 23 are disposed inside the tube 21. The focused ion beam irradiation unit 20 has a configuration in which an ion beam generated by the ion beam source 22 is narrowed by the ion beam optical system 23, whereby a focused ion beam FIB is formed, and the corresponding focused ion beam FIB is emitted from an emission port 21a of the tube 21.

The electron beam irradiation unit 10 and the focused ion beam irradiation unit 20 are disposed such that the irradiated focused ion beam FIB and the irradiated electron beam EB intersect with each other. The stage SG holds the sample M such that the surface Ma of the sample M is disposed at the intersection position of the focused ion beam FIB and the electron beam EB, or near the intersection position.

The stage SG is configured to be capable of moving in each of a horizontal direction, a vertical direction, and a rotation direction, with the sample M held thereon. The stage SG holds the sample M such that the surface Ma of the sample M faces the emission port 11a of the electron beam irradiation unit 10. Also, since the electron beam EB is irradiated in a direction to intersect with the focused ion beam FIB, the surface Ma which is irradiated with the focused ion beam FIB can be irradiated with the electron beam EB. Therefore, it becomes possible to observe the surface Ma while the surface Ma is being processed by the focused ion beam FIB.

If the surface Ma of the sample M is irradiated with the electron beam EB, charged particles such as secondary electrons Es and secondary ions are generated from the surface Ma. The secondary electron detecting unit 30 detects the secondary electrons Es generated at the surface Ma of the sample M. The detection result of the secondary electron detecting unit 30 can be used to acquire a secondary electron image of the surface Ma.

The gas supplying unit 40 supplies a gas G onto the surface of the sample M. The gas supplying unit 40 is disposed such that a gas jetting unit 40a is positioned inside the vacuum chamber CB. The gas supplying unit 40 is fixed to the vacuum chamber CB such that the gas jetting unit 40a faces the stage SG. The gas supplying unit 40 can supply a gas for etching, a gas for deposition, and the like onto the surface Ma of the sample M.

The gas for etching is for selectively accelerating etching in a case of etching the sample M by the focused ion beam FIB. The gas for etching can be appropriately selected according to the material of the sample M. The gas for etching such as xenon fluoride for a Si-based sample M or water for an organic sample M is supplied onto a sample M while the sample M is irradiated with the focused ion beam FIB, whereby it is possible to selectively accelerate etching.

The gas for deposition is for forming a deposition film of sediment such as a metal or an insulator on the surface of a sample M. The gas for deposition such as a compound gas containing phenanthrene, platinum, carbon, tungsten, or the like is supplied onto a sample M while the sample M is irradiated with the focused ion beam FIB, whereby a solid component obtained by decomposition of the gas for deposition is deposited on the surface Ma of the sample M.

Figure 3:
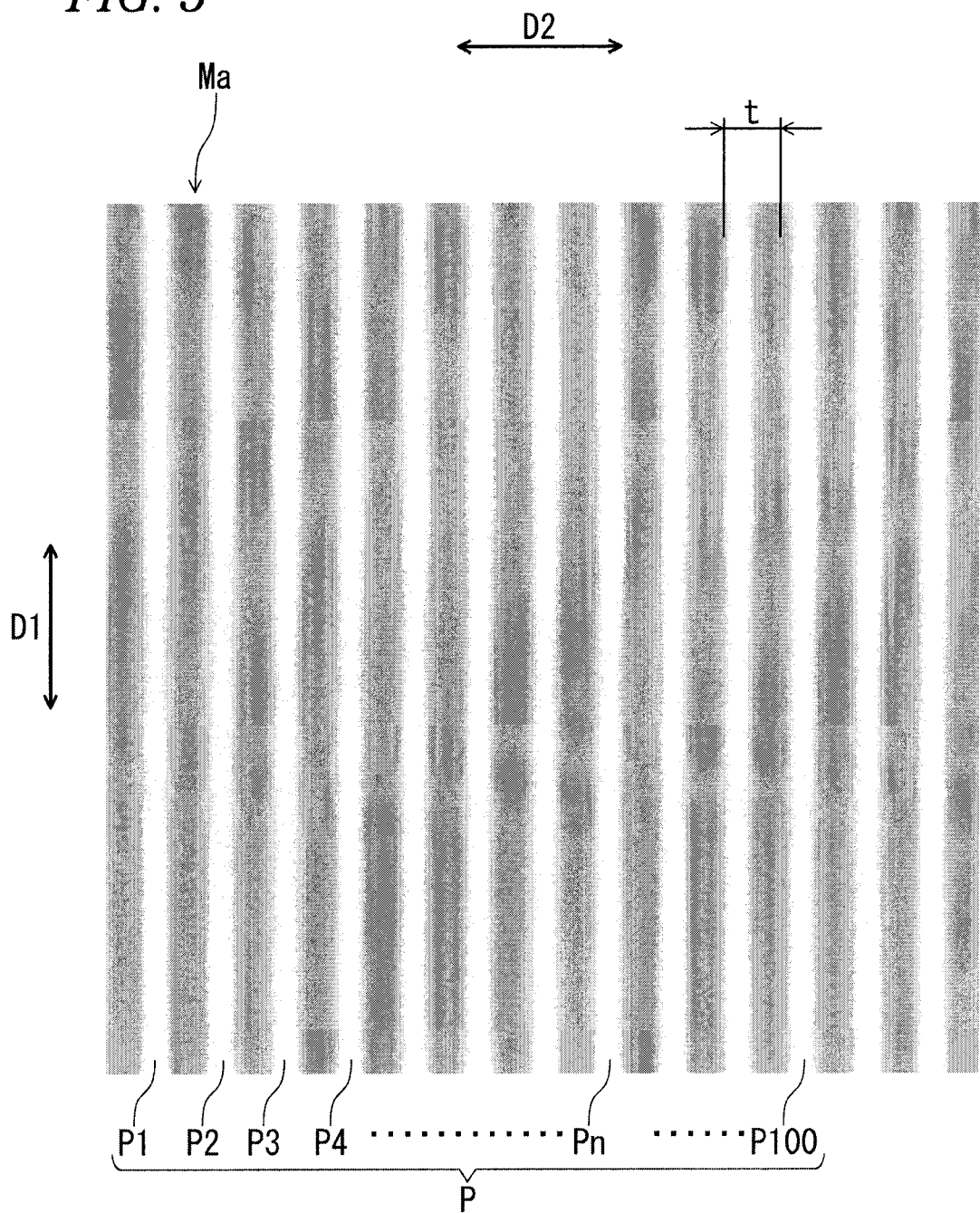
FIG. 3 is an SEM image showing the configuration of a surface Ma of a sample M.

In the present embodiment, as a sample M, a semiconductor device having repetitive patterns formed on a surface Ma is used. FIG. 3 is a SEM image illustrating the configuration of a surface Ma of a sample M. As shown in FIG. 3, on the surface Ma, a plurality of belt-shaped patterns P (P1, P2, . . . , and Pn) extending in a first direction (a longitudinal direction in FIG. 3) D1 is arranged side by side in a second direction (a transverse direction in FIG. 3) D2. The individual patterns P are arranged with a pitch t. The pitch t is set to about several tens of nanometers (for example, 25 nm).

The controller CONT is configured to generally control the above described individual component units and be able to change the accelerating voltage and beam current of each of the tube 11 of the electron beam irradiation unit 10 and the tube 21 of the focused ion beam irradiation unit 20. The controller CONT is configured to change the accelerating voltage or beam current of the focused ion beam irradiation unit 20, thereby capable of freely adjusting the beam diameter of the focused ion beam FIB. Therefore, it is possible to locally perform depositing and etching on a sample M. Further, during etching, it is possible to freely change the processing accuracy from rough processing to finishing by adjusting the beam diameter.

Also, the controller CONT includes an image forming unit (an image acquiring unit) 30a which converts the detection result of the secondary electron detecting unit 30 into a signal, thereby generating observation image data. After the observation image data is generated, the controller CONT can control the display DP such that the display DP displays an observation image based on the observation image data. The controller CONT includes a storage unit 30b which stores the generated observation image. Also, the controller CONT includes a cell count unit 30c which counts patterns in the observation image. Further, the controller CONT includes the image shift unit 30d which shifts the position of the scan range of the electron beam EB by the scan electrode 15. Furthermore, the controller CONT includes a stage controller 30e which moves the stage SG if the scan range is shifted to a predetermined position.

Also, the controller CONT is connected to an input unit IP which is used by an operator to perform inputting. The controller CONT controls the individual components based on signals input by the input unit IP. For example, the operator can adjust the irradiation positions and beam diameters of the focused ion beam FIB and the electron beam EB through the input unit IP. In this case, the operator can observe a desired area of the surface Ma by irradiating the desired area with the electron beam EB, or perform observation and formation of a deposition film by irradiating a desired area with the focused ion beam FIB.

Subsequently, a method of counting the patterns P formed on the surface Ma of the sample M shown in FIG. 3 and processing a predetermined pattern by the charged particle beam apparatus 100 configured as described above will be described. In the present embodiment, it will be described for an exemplary case in which positional information of a target pattern of the process is known, the target pattern selected from among the patterns P formed on the surface Ma. The positional information may be, for example, the count value of a final point in a case of sequentially counting from a start point and is set to, for example, 100.

Figure 4:
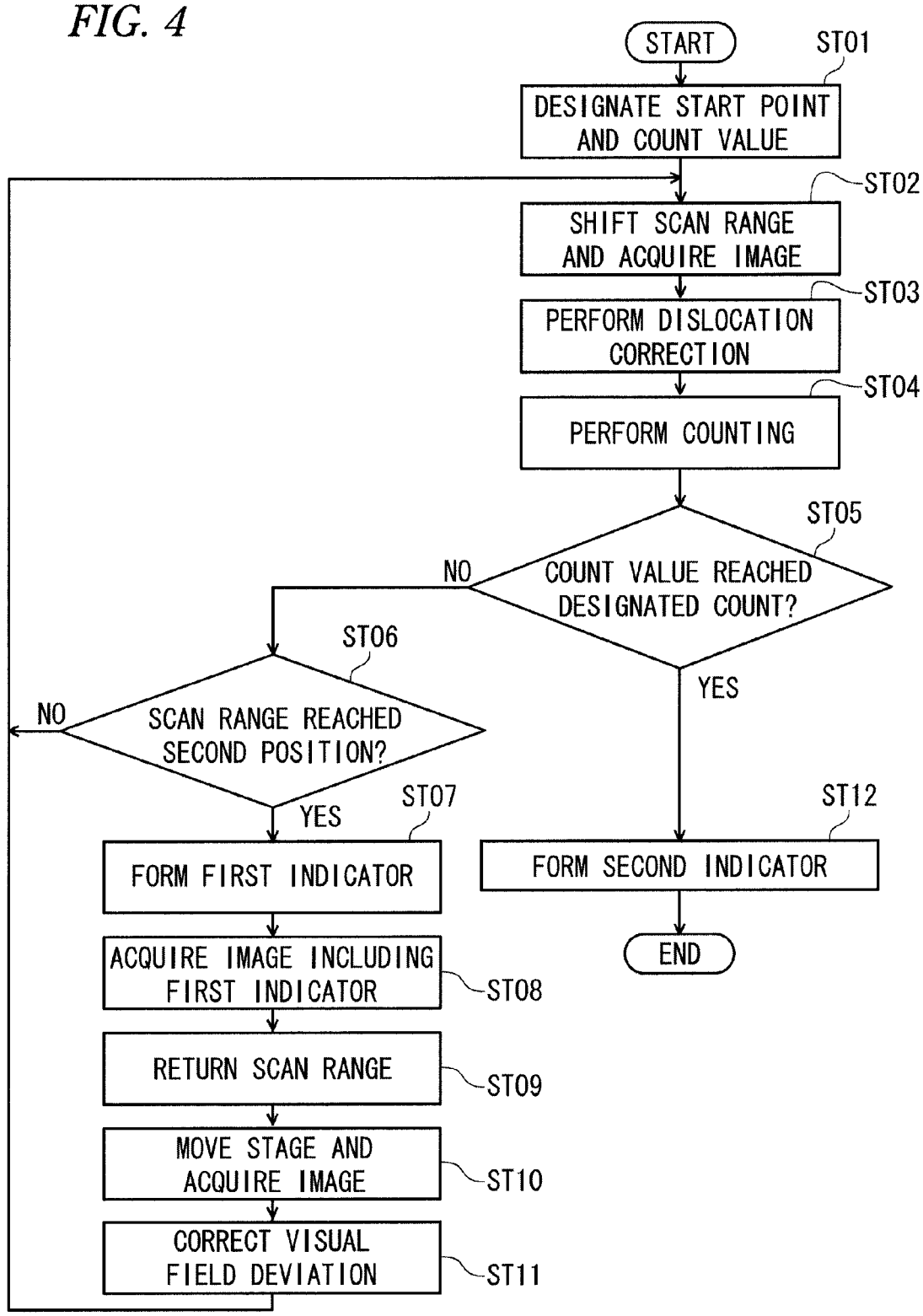
FIG. 4 is a flow chart illustrating an operation of the charged particle beam apparatus 100.

In this case, counting is performed along the arrangement of the patterns from a pattern disposed at the start point from among the plurality of patterns P on the surface Ma, until the count value matches with the count value of the final point. Thereafter, a pattern whose count value matches with the positional information of the pattern which is the target of the process is processed by irradiation with the focused ion beam FIB and the like. FIG. 4 is a flow chart illustrating an operation of the charged particle beam apparatus 100. FIGS. 5A to 7D are views illustrating observation images which are acquired by the charged particle beam apparatus 100.

First, initial setting of setting the sample M on the stage SG is performed. After the initial setting finishes, the controller CONT performs control such that the electron beam EB is irradiated, for example, in a direction parallel to the central axis of the tube 11.

If a predetermined range is scanned by the electron beam EB, secondary electrons are detected by the secondary electron detecting unit 30 and are converted into observation image data by the image forming unit 30a, and then an observation image is displayed on the display DP. The operator inputs a pattern (a start point) P to be a reference of counting from among the plurality of patterns P, from the input unit IP, and inputs the count value of a pattern to be a target of the process to the input unit IP. Based on the input results from the input unit IP, the controller CONT designates the start point and the count value (STEP ST01). The image shift unit 30d of the controller CONT shifts the position Ir of the scan range of the electron beam EB on the surface Ma such that the pattern P of the designated start point is included in the field of vision of the electron beam irradiation unit 10 (image shift). As the pattern P of the start point, for example, a pattern P which is arranged in an edge portion in the second direction D2 of the surface Ma in which the patterns P are arranged may be set, or a pattern P which is arranged at the irradiation position in a case where the electron beam EB is irradiated in parallel to the central axis of the tube 11 may be set.

Figure 5A:
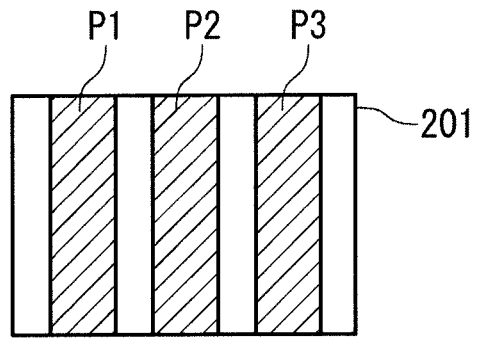
FIGS. 5A to 5D are views illustrating observation images which are obtained by the charged particle beam apparatus 100.

FIG. 5A shows an observation image 201 which is displayed on the display DP in that case.

As shown in FIG. 5A, in the observation image 201, three patterns of a pattern P1 which is the start point from among the plurality of patterns P, the next pattern P2 to the corresponding pattern P1, and the next pattern P3 but one to the corresponding pattern P1 are included in the field of vision.

Thereafter, the controller CONT shifts the scan range of the electron beam EB in a direction from the pattern P1 to the pattern P3 by one pitch, and an observation image of the surface Ma is formed by the image forming unit 30a (STEP ST02). The controller CONT controls the display DP such that the display DP displays the formed observation image, and stores the formed observation image in the storage unit 30b. Also, if necessary, the controller CONT compares the observation image output on the display DP with the observation image stored in the storage unit 30b, thereby performing a pattern matching process, thereby performing dislocation correction on an observation position (the scan range of the electron beam EB) (STEP ST03).

Figure 5B:
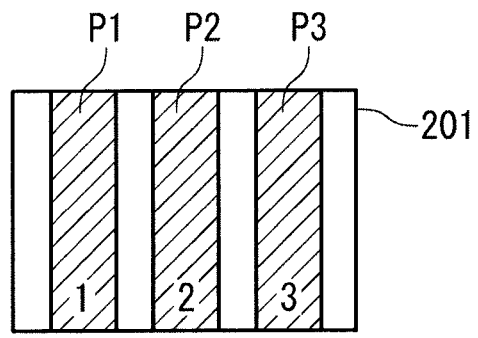

The cell count unit 30c of the controller CONT counts the patterns P based on the observation image 201 (STEP ST04). Based on the count result, the cell count unit 30c performs control such that the display DP displays the count values (numbers 1 to 3) on corresponding patterns P1 to P3 as shown in FIG. 5B. Since the count values are displayed on the observation image 201, the operator can intuitively discriminate the count values of the patterns P.

Based on the count result, the cell count unit 30c determines whether the count value has reached the preset count (designated count) (STEP ST05). Here, since the count value in FIG. 5B is 3, and the designated count is 100, the cell count unit 30c determines that the count result has not reached the designated count ("NO" in STEP ST05).

Here, if the scan range of the electron beam EB reaches a position (a second position) corresponding to the upper limit of the variable range, it becomes impossible to further shift the scan range of the electron beam EB in that direction. For this reason, whenever counting is performed, the controller CONT determines whether the scan range of the electron beam EB has reached the second position (STEP ST06).

Figure 5C:
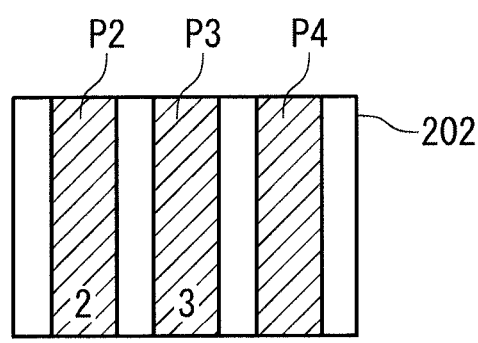
Figure 5D:
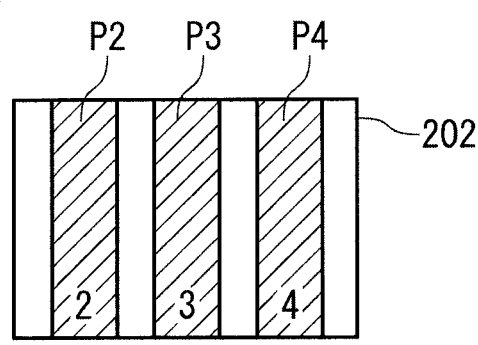

In a case where it is determined that the scan range of the electron beam EB has not reached the second position ("NO" in STEP ST06), it is possible to further shift the scan range of the electron beam EB in that direction. Therefore, the controller CONT shifts the scan range of the electron beam EB only by one pitch of the patterns P, and performs control such that the operations of STEPS ST02 to ST03 are performed and the counting operation of STEP ST04 is performed. As a result, for example, as shown in FIG. 5C, an observation image 202 including three patterns of the patterns P2 to P4 is newly obtained. The observation image 202 becomes a state where the patterns P has been shifted by one pitch, as compared to the observation image 201. Also, a counting operation is performed, whereby a new count value "4" is displayed so as to overlap the pattern P4 as shown in FIG. 5D.

In this case, for example, as shown in FIGS. 5B and 5C, the scan range of the electron beam EB is shifted such that two (the patterns P2 and P3) of the three patterns P1 to P3 are included in the field of vision. Like this, the scan range of the electron beam EB is shifted such that patterns which are included in the latest observation image remain in the new observation image, whereby the accuracy of pattern matching is improved. Therefore, the accuracy of dislocation correction is improved.

If the scan range of the electron beam EB is gradually shifted as described above, the count value gradually increases. The controller CONT stores the displacement of the scan range of the electron beam EB. For example, in FIG. 6A, patterns P49 to P51 whose count values are 49 to 51 are shown as an observation image 249. If the count value increases and the scan range of the electron beam EB reaches the second position ("YES" in STEP ST06), it becomes impossible to further shift the scan range of the electron beam EB in the same direction. Then, the controller CONT returns the scan range of the electron beam EB for a moment, and shifts the stage SG, thereby obtaining an image equivalent to the observation image 249. This will be described in detail below. First, the controller CONT performs control such that an indicator is formed at a predetermined position on the surface Ma of the sample M so as to be discriminable in the observation image 249 (STEP ST07). It is preferable to form that indicator at a position on the sample M corresponding to the central part of the observation image 249. Therefore, the controller CONT forms the indicator on the pattern P50 arranged at the center of the observation image 249 from among the three patterns P49 to P51.

Figure 6A:
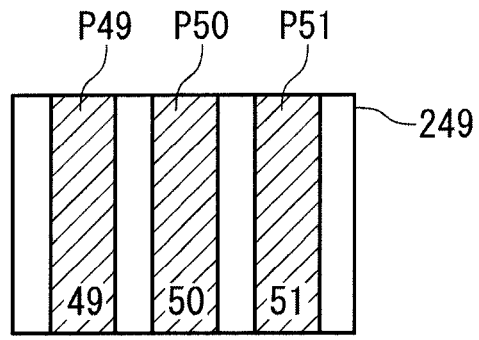
FIGS. 6A to 6D are views illustrating observation images which are obtained by the charged particle beam apparatus 100.
Figure 6B:
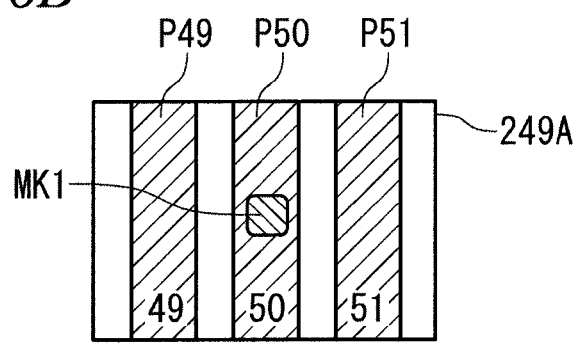

In a case of forming that indicator, for example, the controller CONT performs control such that the gas supplying unit 40 supplies the deposition gas G such as carbon gas while the pattern P50 is irradiated with the focused ion beam FIB. As a result, a first indicator MK1 is formed of a deposition film on the pattern P50 by deposition as shown in FIG. 6B. Also, since the deposition film is formed by the focused ion beam FIB, it is possible to minimize damage of the sample M. Further, it becomes possible to easily specify a process position when switching is performed between the focused ion beam irradiation unit 20 and the electron beam irradiation unit 10, without losing sight of the first indicator MK1.

Thereafter, the controller CONT performs control such that the second position is irradiated with the electron beam EB, thereby acquiring an observation image 249A including the first indicator MK1 (STEP ST08). While controlling the display DP such that the display DP displays the acquired observation image 249A including the first indicator MK1, the controller CONT stores the observation image 249A in the storage unit 30b.

Figure 6C:
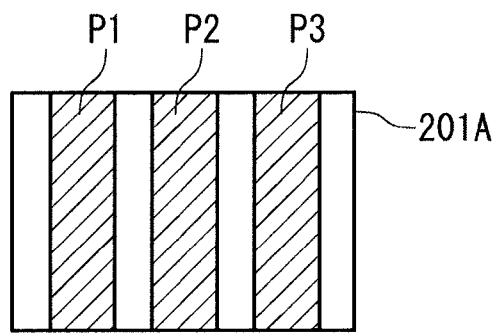

Subsequently, the image shift unit 30d of the controller CONT returns the scan range of the electron beam EB to a position where the pattern P1 which is the start point is disposed (STEP ST09). As a result, as shown in FIG. 6C, an observation image 201A which is output on the display DP becomes the same image as the observation image 201 (see FIG. 5A) in the case where the first position is scanned by the electron beam EB.

Figure 6D:
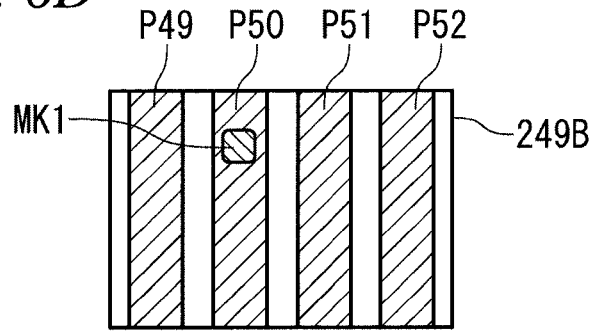

Subsequently, the controller CONT controls the stage controller 30e such that the stage controller 30e moves the stage SG with the scan range of the electron beam EB fixed at the first position. In this case, the controller CONT controls the display DP such that the display DP displays an image of a wide range at a magnification of about 1/2 times to 1/1.5 times. Thereafter, based on the displacement of the scan range of the electron beam EB stored in the storage unit 30b, the stage controller 30e moves the stage SG by a distance corresponding to the corresponding displacement. As a result, an observation image 249B including the pattern P50 having the first indicator MK1 as shown in FIG. 6D is acquired (STEP ST10).

Figure 7A:
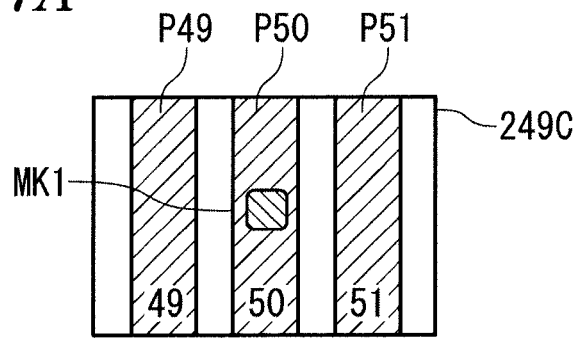
FIGS. 7A to 7D are views illustrating observation images which are obtained by the charged particle beam apparatus 100.
Figure 7B:
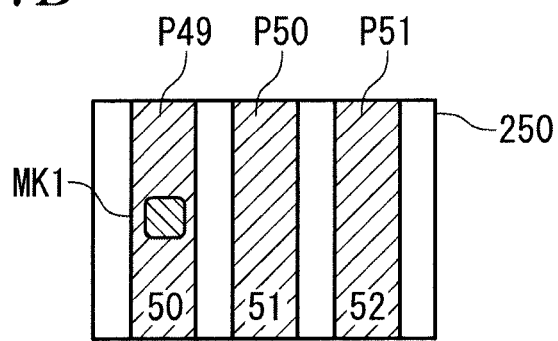

Also, since the accuracy of movement of the stage SG is lower than the accuracy of shift of the scan range of the electron beam EB, in a case of moving the stage SG, the first indicator MK1 may not be disposed at the central part of the observation image. As this example, there is a case where the first indicator MK1 is disposed at a position deviated from the central part of the observation image. In this case, the scan range of the electron beam EB is adjusted, whereby the position of the observation image is adjusted. Also, as another example, there is a case where the first indicator MK1 is not included in the observation image. In this case, the magnification is reduced until it is possible to check the first indicator MK1, whereby an image of a wider range is displayed. In a case where it is possible to check the first indicator MK1, the controller CONT changes the scan range of the electron beam EB, and returns (increases) the magnification, thereby adjusting the position of the observation image. After the stage SG is moved based on the displacement of the scan range of the electron beam EB from the first position to the second position, the controller CONT adjusts the scan range of the electron beam EB or the magnification, not the stage SG, thereby correcting the visual field deviation of the electron beam irradiation unit 10 (STEP ST11). As a result, an observation image 249C in which the patterns P49 to P51 having the count values of 49 to 51 are included in the field of vision as shown in FIG. 7A is acquired. This observation image 249C is the same image as the observation image 249A shown in FIG. 6B. Also, since the scan range of the electron beam EB is almost parallel to the central axis of the tube 11, it has a sufficient margin until it reaches the upper limit of the variable range of the scan range of the electron beam EB.

Figure 7C:
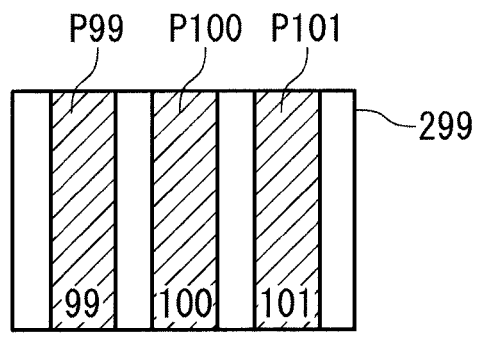

Thereafter, while performing control such that the scan range of the electron beam EB is gradually moved and observation images are acquired, the controller CONT performing control such that dislocation correction and counting are performed (STEPS ST02 to ST04), until the count value reaches the designated count. Also, if the scan range of the electron beam EB reaches the upper limit of the variable range, the first indicator MK1 is formed on a pattern P, and the scan range of the electron beam EB is returned, and the stage SG is moved, and an observation image is acquired, and correction on a visual field deviation is performed (STEPS ST06 to ST11). By this operation, an observation image 299 in which a pattern P100 corresponding to the designated count is included in the field of vision as shown in FIG. 7C is acquired.

Figure 7D:
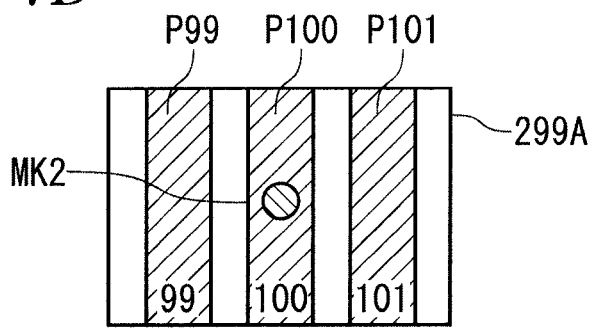

After the count value reaches the designated count (the count value "100") ("YES" in STEP ST05), the controller CONT forms a second indicator MK2 on the pattern P100 as shown in FIG. 7D (STEP ST12). The second indicator MK2 is formed in a shape different from that of the first indicator MK1. After the scan range reaches the pattern P100 which is the target of the process, the controller CONT processes the pattern P100 having the second indicator MK2 formed thereon by performing irradiation with the focused ion beam FIB and the like.

As described above, according to the present embodiment, since it is possible to acquire observation images of the surface Ma by shifting the scan range of the electron beam EB on the surface Ma of the sample M, it is unnecessary to move the stage SG in order to acquire observation images. Therefore, it is possible to avoid detection errors attributable to vibration, drift, or the like of the stage SG. As a result, it is possible to obtain a charged particle beam apparatus 100 having high observation accuracy.

Also, the technical range of the present invention is not limited to the above described embodiment, and can be appropriately modified within the scope of the present invention.

For example, in the above described embodiment, observation images are acquired using the electron beam EB, whereby counting of the patterns P is performed. However, observation images may be acquired using the focused ion beam FIB, whereby counting of the patterns P may be performed.

In the above described embodiment, as examples of the first indicator MK1 which is formed on the pattern P (P50) corresponding to the second position and the second indicator MK2 which is formed on the pattern P (P100) of the designated count, deposition films due to the focused ion beam FIB have been described. However, the present invention is not limited thereto. The first indicator MK1 and the second indicator MK2 may be formed by any other method such as etching if they can be shown in observation images. For example, the first indicator MK1 or the second indicator MK2 may be a deposition film due to the electron beam EB, or may be formed by a mechanical process using a microprobing system. Also, in a case of forming a deposition film by the focused ion beam FIB, if a gas field ion source (GFIS) is used as an ion source, it becomes possible to reduce damage of samples M.

In the above described embodiment, a mode in which the second position for forming the first indicator MK1 is set according to the upper limit of the variable range of the scan range of the electron beam EB has been described as an example. However, the present invention is not limited thereto. The second position may be set according to the number of repetitive patterns P (the count number) of each pattern array formed on the surface Ma of the sample M. For example, whenever n-number of patterns P (n is an integer of 2 or greater) are counted, the first indicator MK1 may be formed. According to this configuration, it is possible to perform sampling inspection of samples M.

Also, in this case, since the patterns P are repeatedly formed, it can be said that a case where the patterns P are not at their original positions is a defect. According to the above described charged particle beam apparatus 100, since observation images are acquired while the patterns P are counted, in a case where there is a defect before the designated count value, it is possible to specify the position of that defect. Also, the form of use may be specialized for specifying the positions of defects.

Also, in the above described embodiment, as an example of the repetitive patterns P which are formed on the surface Ma of the sample M, stripe patterns which are arranged in one direction have been described. However, the present invention is not limited thereto. For example, even with respect to repetitive patterns arranged longitudinally and transversely, the same description is possible. In this case, the designated count value is expressed by, for example, an address on two dimensions (such as an X coordinate and a Y coordinate).

The above described charged particle beam apparatus 100 may be provided with a display DP that displays the images acquired by an image acquiring unit (the secondary electron detecting unit 30 and the controller CONT).

According to this configuration, since the charged particle beam apparatus 100 includes the display DP, it is possible to save time and effort for connecting a separate display.

In the above described charged particle beam apparatus 100, predetermined repetitive patterns are formed on the sample, and the controller CONT performs an operation of performing control such that the count values of the repetitive patterns are shown in the images which are acquired by the image acquiring unit.

According to this configuration, in a case where the predetermined repetitive patterns have been formed on the sample, it is possible to count the repetitive patterns with a high degree of accuracy.

In the above described charged particle beam apparatus 100, the second position is set according to a variable range of the scan range of the charged particle beam EB.

According to this configuration, since the second position is set according to the variable range of the scan range of the charged particle beam EB, it is possible to effectively use the variable range of the scan range of the charged particle beam EB.

In the above described charged particle beam EB apparatus 100, predetermined repetitive patterns are formed on the sample, and the second position is set according to the number of repetitive patterns of each pattern array.

According to this configuration, in a case where the predetermined repetitive patterns are formed on the surface, the second position is set according to the number of repetitive patterns of each pattern array, it is possible to reduce the load of the charged particle beam irradiation unit (electron beam irradiation unit 10), and it is possible to obtain stable detection accuracy.

In the above described charged particle beam EB apparatus 100, the indicator is formed by deposition using the charged particle beam, and during formation of the indicator, a deposition gas is supplied onto the sample.

According to this configuration, since the indicator is formed by deposition using the charged particle beam, it is possible to form the indicator with a high degree of accuracy.

In the above described charged particle beam EB apparatus 100, after adjustment of the position of the stage SG, the controller CONT performs control such that an operation of returning the scan range of the charged particle beam EB is performed.

According to this configuration, after the position of the stage SG is adjusted, the scan range of the charged particle beam EB is returned to the first position. Thereafter, it is possible to shift the scan range of the charged particle beam EB again.

In the above described charged particle beam apparatus 100, the controller performs control such that the indicator is formed by the charged particle beam EB so as to be disposed at the central part of the image in which the indicator is included.

According to this configuration, since the indicator is disposed at the central part of the image in which the indicator is included, it becomes easy to use the corresponding image to determine the indicator in a case of moving the stage SG.

What is claimed is:
1. A charged particle beam apparatus comprising:
a stage configured to hold a sample and to be movable;
a charged particle beam irradiation unit configured to irradiate the sample with a charged particle beam;
an image acquiring unit configured to detect secondary electrons generated from the sample due to the irradiation with the charged particle beam and to acquire images of the sample; and
a controller configured to control the charged particle beam apparatus and perform operations comprising:
an irradiating operation to irradiate a first position of the sample with the charged particle beam while changing a scan range of the charged particle beam such that the scan range of the charged particle beam moves from the first position;
a first image acquiring operation to control the image acquiring unit to acquire an image of each portion where the charged particle beam moves;
an indicator forming operation to form an indicator at a second position by the charged particle beam when the scan range of the charged particle beam reaches the second position;
a second image acquiring operation to control the image acquiring unit to acquire an image of the second position in a state where the indicator is formed; and
an adjusting operation to adjust a relative position between the stage and the scan range of the charged particle beam.
2. The charged particle beam apparatus according to claim 1 further comprising:

a display configured to display the images acquired by the image acquiring unit.

3. The charged particle beam apparatus according to claim 1,
wherein predetermined repetitive patterns are formed on the sample, and
wherein the controller performs a displaying operation to display the count values of the repetitive patterns within the images acquired by the image acquiring unit.

4. The charged particle beam apparatus according to claim 1,
wherein the second position is set according to a variable range of the scan range of the charged particle beam.

5. The charged particle beam apparatus according to claim 1,
wherein predetermined repetitive patterns are formed on the sample, and
wherein the second position is set according to the number of repetitive patterns of each pattern array.

6. The charged particle beam apparatus according to claim 1 further comprising:
a gas supplying unit configured to supply a deposition gas onto the sample,
wherein the indicator is formed by deposition using the charged particle beam while the deposition gas is supplied by the gas supplying unit.

7. The charged particle beam apparatus according to claim 1,
wherein the controller performs control of the charged particle beam to return the scan range of the charged particle beam to the first position after adjustment of a position of the stage.

8. The charged particle beam apparatus according to claim 1,
wherein the controller performs control of the charged particle beam to form the indicator at a position corresponding to a central part of the image in which the indicator image is included.

* * * * *